United States Patent
Wang et al.

(10) Patent No.: US 9,646,823 B2
(45) Date of Patent: May 9, 2017

(54) SEMICONDUCTOR DIELECTRIC INTERFACE AND GATE STACK

(71) Applicant: Taiwan Semiconductor Manufacturing Company, Ltd., Hsin-Chu (TW)

(72) Inventors: Chien-Hsun Wang, Hsinchu (TW); Shih-Wei Wang, Hsin-Chu (TW); Gerben Doornbos, Leuven (BE); Georgios Vellianitis, Heverlee (BE); Matthias Passlack, Huldenberg (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/464,434

(22) Filed: Aug. 20, 2014

(65) Prior Publication Data
US 2014/0353771 A1 Dec. 4, 2014

Related U.S. Application Data

(63) Continuation-in-part of application No. 13/774,852, filed on Feb. 22, 2013, now Pat. No. 9,390,913.

(51) Int. Cl.
*H01L 21/02* (2006.01)
*H01L 21/28* (2006.01)
(Continued)

(52) U.S. Cl.
CPC .. *H01L 21/02304* (2013.01); *H01L 21/02181* (2013.01); *H01L 21/02312* (2013.01);
(Continued)

(58) Field of Classification Search
CPC .............. H01L 29/512; H01L 29/517; H01L 21/02304; H01L 21/28211; H01L 21/28194; H01L 21/28238
(Continued)

(56) References Cited

U.S. PATENT DOCUMENTS 6,022,410 A * 2/2000 Yu et al. ............... 117/103
6,607,973 B1 * 8/2003 Jeon ....................... 438/591
(Continued)

FOREIGN PATENT DOCUMENTS

| JP | 2002101769 | | 4/2002 |
|---|---|---|---|
| JP | 2006196713 | † | 7/2006 |
| WO | 2012/062966 A1 | † | 5/2012 |

OTHER PUBLICATIONS

Kuniharu Takei et al., "Benchmarking the Performance of Ultrathin Body InAs-on-insulator Transistors as a Function of Body Thickness," Applied Physics Letters 99, , 2011 American Institute of Physics, 4 pages.
(Continued)

*Primary Examiner* — Christine Enad
(74) *Attorney, Agent, or Firm* — Haynes and Boone, LLP

(57) ABSTRACT

A semiconductor/dielectric interface having reduced interface trap density and a method of manufacturing the interface are disclosed. In an exemplary embodiment, the method of forming a semiconductor device includes receiving a substrate and forming a termination layer on a top surface of the substrate. The termination layer includes at least one of hydrogen, deuterium, or nitrogen. The method further includes depositing a dielectric layer on the termination layer such that the depositing of the dielectric layer does not disrupt the termination layer. The termination layer may be formed by a first deposition process that deposits a first material of the termination layer and a subsequent deposition process that introduces a second material of the termination layer into the first material. The termination layer may also be formed by a single deposition process that deposits both a first material and a second material of the termination layer.

19 Claims, 10 Drawing Sheets

(51) Int. Cl.
- *H01L 29/51* (2006.01)
- *H01L 21/306* (2006.01)
- *H01L 29/66* (2006.01)
- *H01L 29/78* (2006.01)

(52) U.S. Cl.
CPC ...... *H01L 21/28264* (2013.01); *H01L 21/306* (2013.01); *H01L 29/513* (2013.01); *H01L 29/517* (2013.01); *H01L 29/66522* (2013.01); *H01L 29/78* (2013.01)

(58) Field of Classification Search
USPC ............................ 257/411; 438/591, 763
See application file for complete search history.

(56) References Cited

U.S. PATENT DOCUMENTS

| | | | |
|---|---|---|---|
| 6,797,644 | B2 | 9/2004 | Watt et al. |
| 7,015,153 | B1 * | 3/2006 | Triyoso .............. C23C 14/0057 438/778 |
| 7,498,227 | B2 | 3/2009 | Kim |
| 7,521,376 | B2 | 4/2009 | Frank et al. |
| 7,704,896 | B2 | 4/2010 | Haukka et al. |
| 7,820,558 | B2 | 10/2010 | Ohmi et al. |
| 8,026,136 | B2 | 9/2011 | Shih et al. |
| 8,084,315 | B2 | 12/2011 | Yamamoto et al. |
| 8,987,095 | B2 | 3/2015 | Lee |
| 2002/0050608 | A1 * | 5/2002 | Landheer et al. ............ 257/310 |
| 2006/0060131 | A1 * | 3/2006 | Atanackovic .................. 117/84 |
| 2006/0214224 | A1 | 9/2006 | Ohmi et al. |
| 2006/0264067 | A1 * | 11/2006 | Kher et al. ................... 438/785 |
| 2008/0121932 | A1 | 5/2008 | Ranade |
| 2008/0286949 | A1 | 11/2008 | Atanackovic |
| 2010/0001334 | A1 * | 1/2010 | Mieno ........................ 257/316 |
| 2010/0123993 | A1 | 5/2010 | Laor |
| 2013/0214331 | A1 * | 8/2013 | Laukkanen et al. .......... 257/200 |
| 2013/0307052 | A1 * | 11/2013 | Jenne ................ H01L 21/28282 257/325 |

OTHER PUBLICATIONS

Hyunhyub Ko et al., "Ultrathin Compound Semiconductor on Insulator Layers for High-Performance Nanoscale Transistors," Nature, Nov. 11, 2010, p. 286 (4 pages), vol. 468, 2010 Macmillan Publishers Limited.

www.Nature.com/Nature, "Research: Supplementary Information: Preparation of the $GaSb/Al_{0.2}Ga_{0.8}Sb/InAs$ source wafers used for the epitaxial transfer process," 24 pages.

M. P.J. Punkkinen et al., "Oxidized in-Containing III-V(100) Surfaces: Formation of Crystalline Oxide Films and Semiconductor-Oxide Interfaces," 2011 American Physical Society, Physical Review B 83, 6 pages.

Korean Intellectual Property Office, "Notice of Allowance of Patent", Apr. 2, 2015, 3 pages.

Hausmann, Dennis M., Surface morphology and crystallinity control in the atomic layer deposition (ALD) of hafnium and zirconium oxide thin film, Journal of Crystal Growth, (2003) vol. 249, pp. 251-261.

\* cited by examiner
† cited by third party

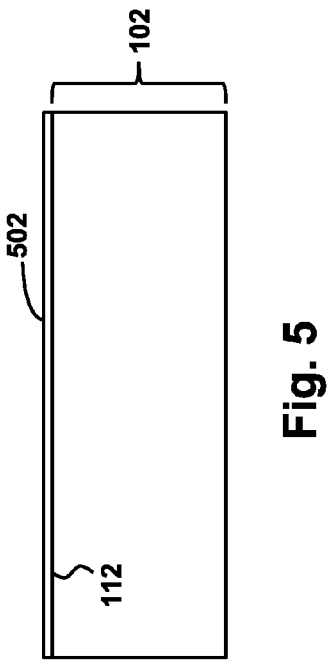
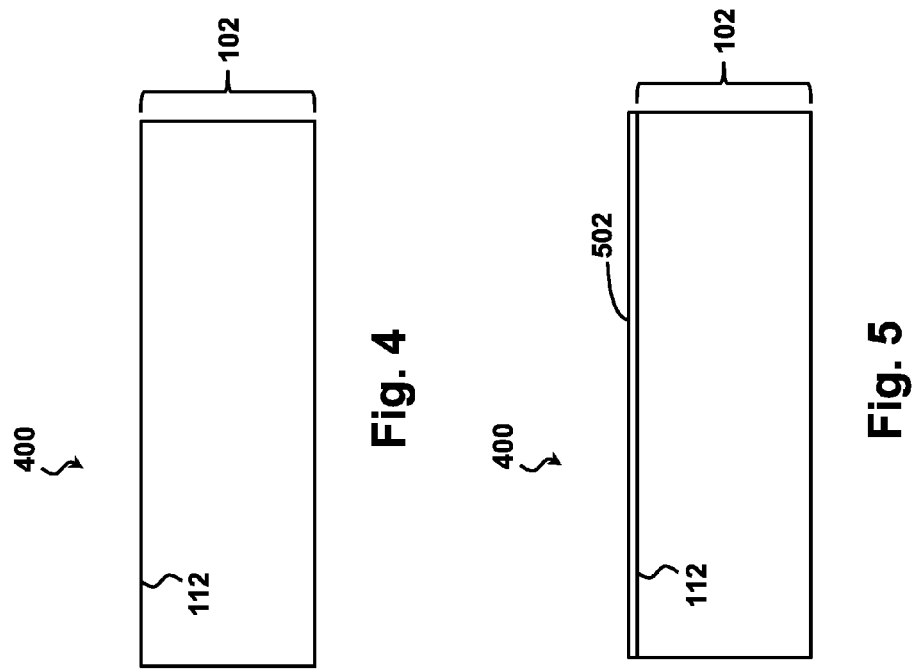
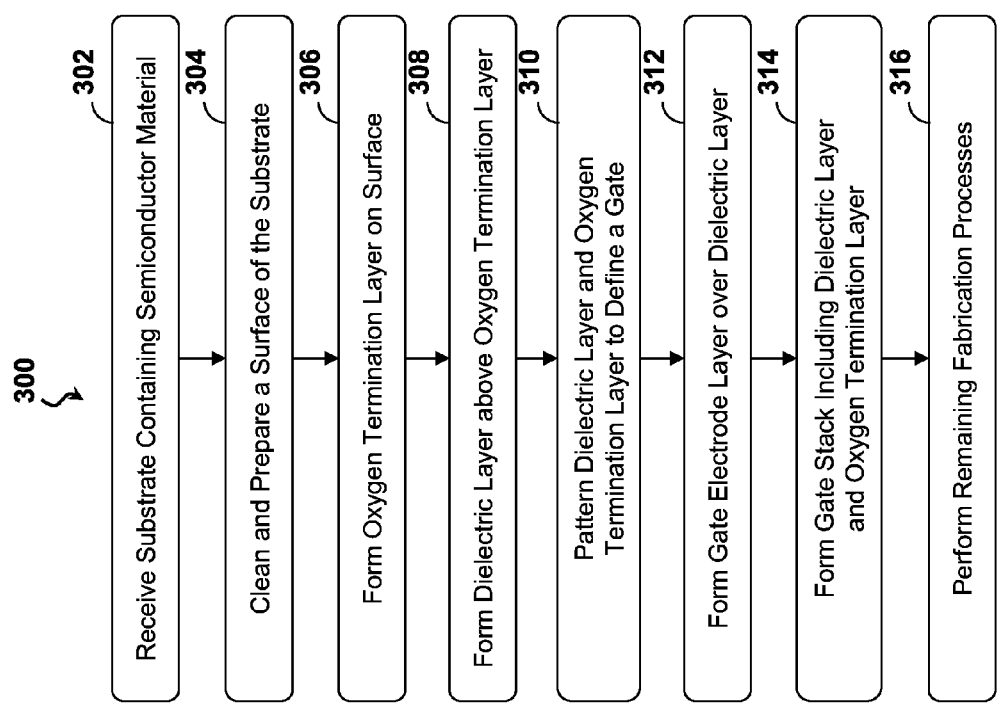

_US 9,646,823 B2_

SEMICONDUCTOR DIELECTRIC INTERFACE AND GATE STACK

CROSS-REFERENCE TO RELATED APPLICATIONS

The present application is a continuation-in-part of U.S. application Ser. No. 13/774,852, filed Feb. 22, 2013, entitled "SEMICONDUCTOR DIELECTRIC INTERFACE AND GATE STACK", which is incorporated herein by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed. For example, novel semiconductor materials, including compound semiconductors, are being investigated to supplement or replace conventional silicon substrates. While these alternative semiconductor materials often possess superior electrical characteristics, just as often they possess their own sets of challenges. Accordingly, this transition to more exacting materials is one of the drivers of new fabrication processes. Therefore, although existing semiconductor fabrication process have been generally adequate, they have not proved entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3 is a flow diagram of a method for forming a dielectric-semiconductor interface having a low interface trap density according to various aspects of the present disclosure.

FIGS. 4 and 5 are diagrammatic cross-sectional views of a semiconductor device undergoing a method of forming a dielectric-semiconductor interface according to various aspects of the present disclosure.

DETAILED DESCRIPTION

Figure 2:
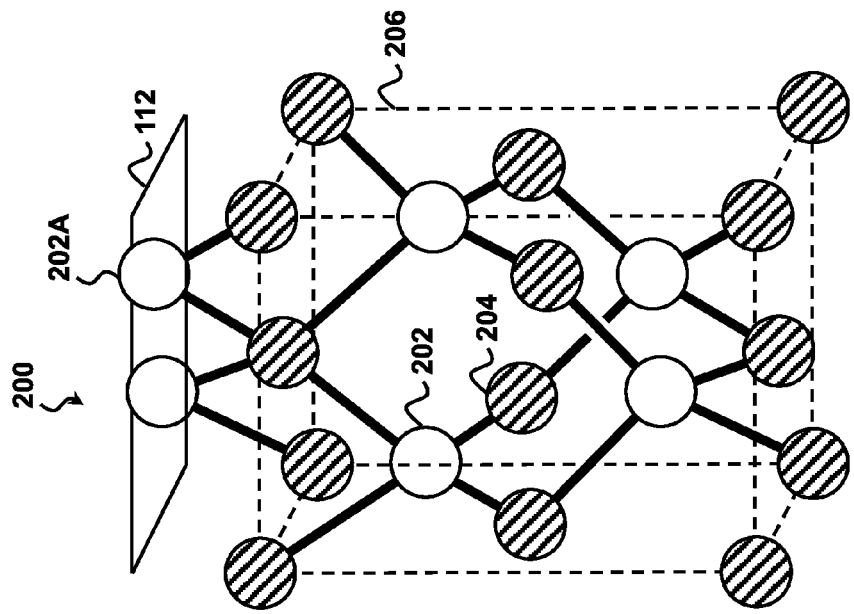
FIG. 2 is a diagrammatic illustration of a molecular model of a compound semiconductor material according to various aspects of the present disclosure.

The present disclosure relates generally to IC device manufacturing and more particularly, to forming a semiconductor/dielectric interface with reduced interface trap density.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
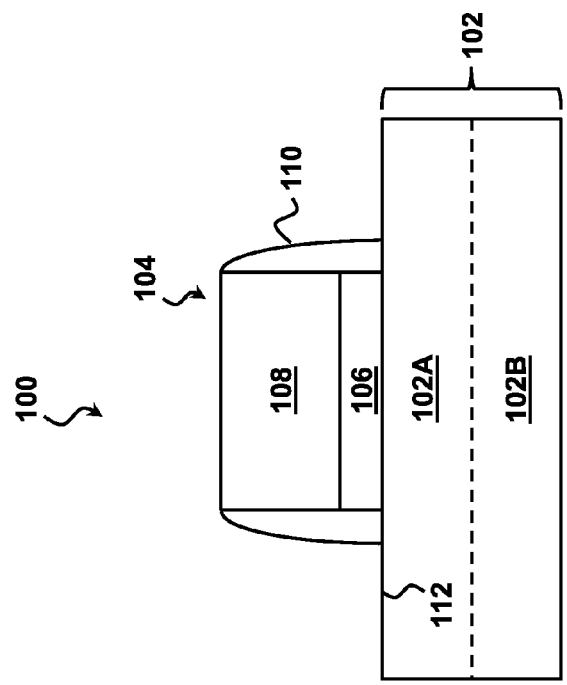
FIG. 1 is a diagrammatic cross-sectional view of an integrated circuit device according to various aspects of the present disclosure.

FIG. 1 is a diagrammatic cross-sectional view of an integrated circuit device 100 according to various aspects of the present disclosure. The integrated circuit device 100 is merely one example of a circuit device formed on a semiconductor substrate 102. It is understood that the principles of the present disclosure apply equally to any and all devices that incorporate such a substrate 102. For example, the principles may be applied to P-channel field effect transistors (PFET), N-channel FET (NFET), metal-oxide semiconductor field effect transistors (MOSFET), complementary metal-oxide semiconductor (CMOS) transistors, FinFETs, bipolar transistors, high voltage transistors, high frequency transistors, bipolar junction transistors, resistors, capacitors, diodes, fuses, other suitable devices, and/or combinations thereof.

In the illustrated embodiment, semiconductor substrate 102 includes a compound semiconductor material. Compound semiconductor materials include $In_{1-X}Ga_XAs$, InP, $Al_{1-X}GaxAs$, $Ga_XAs_XSb$, InSb, $In_XGa_{1-X}SB$, InAsSb, InAlAs, other compound semiconductor materials known in the art, and combinations thereof. Additionally or in the alternative, the substrate 102 may comprise other semiconductors including silicon, germanium, silicon germanium carbide, gallium arsenic phosphide, gallium indium phosphide, and/or other suitable materials. The substrate 102 may also comprise non-semiconductor materials including soda-lime glass, fused silica, fused quartz, calcium fluoride ($CaF_2$), and/or other suitable materials. In some embodiments, the substrate 102 has one or more layers (e.g., substrate layers 102A and 102B) defined within it. For example, a first layer 102A may include a compound semiconductor layer grown on a second layer 102B such as Si, Ge, and/or III-V containing-layer. As another example, the substrate 102 may include a multilayered compound semiconductor heterostructure such that layer 102A includes a first compound semiconductor material and layer 102B includes a second, different, compound semiconductor material. In some embodiments, the substrate layers include an epitaxial layer. Other layered substrates include semiconductor-on-insulator (SOI) substrates. In one such SOI substrate, the substrate 102 includes a buried oxide (BOX) layer formed by a process such as separation by implanted oxygen (SIMOX). In various embodiments, the substrate 102 may take the form of a planar substrate, a fin, a nanowire, and/or other forms known to one of skill in the art.

In some embodiments, the integrated circuit device 100 includes a gate stack 104. In an embodiment utilizing a gate first process, the gate stack 104 comprises a functional gate. Conversely, in an embodiment utilizing a gate last process, the gate stack 104 comprises a dummy gate. An exemplary gate stack 104 includes a gate dielectric layer 106, a gate electrode layer 108, and may include a hard mask layer and/or capping layer (not shown) above the gate electrode layer 108. In some embodiments, spacers 110 are formed on one or more lateral surfaces of the gate stack 104. The gate dielectric layer 106 may comprise a dielectric material. Such materials are commonly characterized by their dielectric constant relative to silicon dioxide. In that regard, the gate dielectric layer 106 may include a high-k dielectric material such as $HfO_2$, HfSiO, HfSiON, HfTa, HfTiO, HfZrO, zirconium oxide, aluminum oxide, hafnium dioxide-alumina ($HfO_2$—$Al_2O_3$) alloy, other suitable high-k dielectric materials, and/or combinations thereof. Additionally or in the alternative, the gate dielectric layer 106 may include other dielectrics such as silicon dioxide, silicon nitride, silicon oxynitride, silicon carbide, amorphous carbon, tetraethylorthosilicate (TEOS), other suitable dielectric material, and/or combinations thereof. The gate dielectric layer 106 may be formed to any suitable thickness using any suitable process including atomic layer deposition (ALD), chemical vapor deposition (CVD), high-density plasma CVD (HDP-CVD), physical vapor deposition (PVD), spin-on deposition, and/or other suitable deposition processes.

The gate stack 104 further includes a gate electrode layer 108. Despite naming conventions such as MOSFET, circuit device 100 includes embodiments with polysilicon-containing gate electrode layers 108 as well as metal-containing electrode layers 108. Accordingly, the gate electrode layer 108 may include any suitable material, such as polysilicon, aluminum, copper, titanium, tantulum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 108 may be formed to any suitable thickness using any suitable process including atomic layer deposition (ALD), chemical vapor deposition (CVD), high-density plasma CVD (HDP-CVD), physical vapor deposition (PVD), and/or other suitable deposition processes.

In embodiments incorporating a hard mask layer, suitable materials for the hard mask layer include, for example, silicon dioxide, silicon nitride, SiON, SiC, SiOC, spin-on glass (SOG), a low-k film, tetraethylorthosilicate (TEOS), plasma enhanced CVD oxide (PE-oxide), high-aspect-ratio-process (HARP) formed oxide, and/or other suitable material. The hard mask layer may be formed to any suitable thickness using any suitable process including atomic layer deposition (ALD), chemical vapor deposition (CVD), high-density plasma CVD (HDP-CVD), physical vapor deposition (PVD), spin-on deposition, and/or other suitable deposition processes.

The structure of the substrate 102, including along surface 112, is disclosed with reference to FIGS. 1 and 2. FIG. 2 is a diagrammatic illustration of a molecular model of a compound semiconductor material 200 according to various aspects of the present disclosure. The illustrated compound semiconductor material 200 is a III-V semiconductor material, although the principles of the present disclosure apply equally to any and all semiconductors. Accordingly, other types of semiconductor materials are both contemplated and provided for. The model illustrates atoms of a Group III material (e.g., aluminum, indium, gallium, and/or combinations thereof) using hollow spheres (e.g., sphere 202) and atoms of a Group IV material (e.g., phosphorus, arsenic, antimony, and/or combinations thereof) using filled spheres (e.g., sphere 204).

Semiconductor materials, including those of the substrate 102, typically possess a crystalline lattice bond structure as illustrated in FIG. 2 by box 206. At surfaces of the substrate 102 (e.g., surface 112), the crystalline lattice is interrupted resulting in unsaturated bonds within the semiconductor material. For example, the atom represented by sphere 202A lies at the surface 112 of the substrate and has unsaturated bonds. These unsaturated bonds may be referred to as interface defects or interface traps. These bonds may resolve themselves via surface reconstruction (alteration of the topology of the surface) and/or through bonding with adjacent materials. However, unresolved unsaturated bonds may produce a surface charge that has the potential to affect the electrical performance of the circuit device 100. For example, the unsaturated bonds along surface 112 of device 100 may increase the switching gate capacitance thereby slowing the switching speed and efficiency of the device 100. This may be of particular concern in high-frequency applications.

Compound semiconductor materials are attractive alternatives to traditional semiconductors for use within the substrate 102. Depending in part on the application, such as the integrated circuit device 100 formed on the substrate 102, compound semiconductor materials possess several advantages including increased electron mobility. High electron mobility often improves high-frequency device response. However, compound semiconductor materials also tend to exhibit an increased number of interface traps, which, as noted above, may impede high-frequency switching. In an example, a compound semiconductor may have approximately on the order of $10^{13}$ defects/$cm^2$ along a semiconductor/dielectric interface. For comparison, an elemental silicon substrate may have approximately on the order of $10^{10}$ defects/cm² along an SI/SIO₂ interface. As can be seen, reducing the interface trap density to the SI/SIO₂ benchmark or lower has the potential to dramatically improve the performance of the resulting device.

Figure 6:
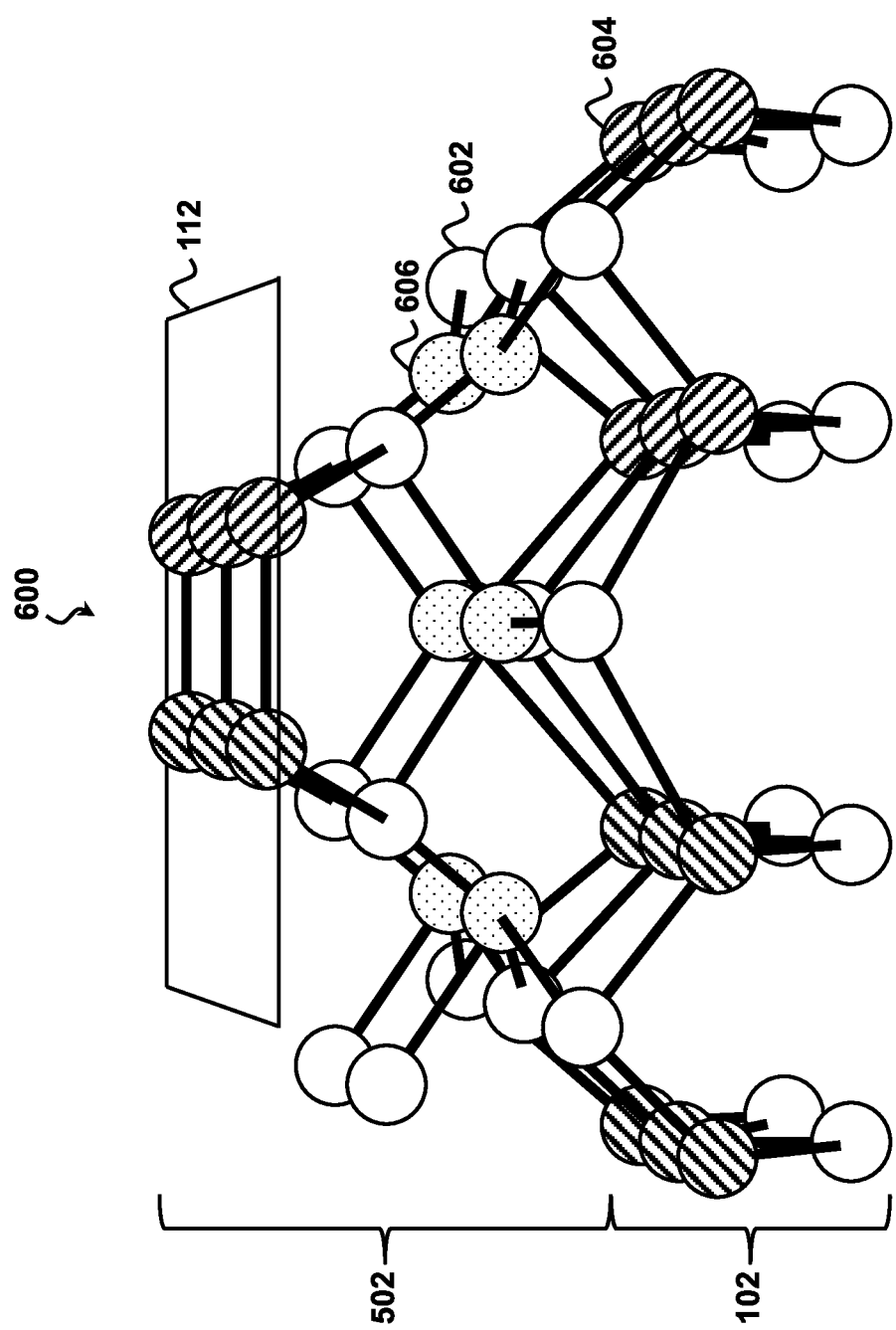
FIG. 6 is a diagrammatic illustration of a molecular model of a substrate interface including a termination layer according to various aspects of the present disclosure

A method 300 for forming a dielectric-semiconductor interface having a reduced interface trap density is described with reference made to FIGS. 3-10. FIG. 3 is a flow diagram of the method 300 for forming a dielectric-semiconductor interface having a low interface trap density according to various aspects of the present disclosure. It is understood that additional steps can be provided before, during, and after the method 300, and some of the steps described can be replaced or eliminated for other embodiments of the method 300. FIGS. 4 and 5 are diagrammatic cross-sectional views of a semiconductor device 400 undergoing the method 300 of forming the dielectric-semiconductor interface according to various aspects of the present disclosure. FIG. 6 is a diagrammatic illustration of a molecular model of a substrate interface 600 including a termination layer 502 according to various aspects of the present disclosure. FIGS. 7-10 are diagrammatic cross-sectional views of the semiconductor device 400 undergoing the method 300 of forming the dielectric-semiconductor interface according to various aspects of the present disclosure.

Referring to FIG. 4 and block 302, a substrate 102 is received. The substrate 102 may be substantially similar to substrate 102 described with respect to FIG. 1. In that regard, substrate 102 may include a compound semiconductor material. Suitable compound semiconductor materials include $In_{1-x}Ga_xAs$, InP, $Al_{1-x}Ga_xAs$, $Ga_{1-x}As_xSb$, InSb, $In_xGa_{1-x}Sb$, InAsSb, InAlAs, other compound semiconductor materials known in the art, and combinations thereof. In addition to or instead of a compound semiconductor material, the substrate 102 may comprise other semiconductors and/or non-semiconductor materials. In some embodiments, substrate 102 has one or more layers defined within it. In one such embodiment, the substrate 102 includes a compound semiconductor layer grown on a Si, Ge, and/or III-V layer. In a further such embodiment, the substrate 102 includes a multilayered compound semiconductor heterostructure. In some embodiments, the substrate layers include an epitaxial layer. Other layered substrates include semiconductor-on-insulator (SOI) substrates. The substrate 102 may take the form of a planar substrate, a fin, a nanowire, and/or other forms known to one of skill in the art.

Referring to block 304, a surface (e.g., surface 112) of the substrate 102 is cleaned and prepared. The cleaning and preparation may include the application of heat, the application of a wet chemical solution (HF, HCl, and/or other solutions), mechanical polishing, the application of a vacuum such as an ultra-high vacuum (i.e., approximately on the order of $10^{-8}$ Torr or less) and/or other suitable cleaning techniques. In some embodiments, the semiconductor of the substrate 102 is deposited and maintained in a vacuum, and thus the surface 112 undergoes minimal cleaning. For example, in one such embodiment, the compound semiconductor is deposited using a UHV (ultra-high vacuum) MBE (molecular beam epitaxy) tool and remains within the tool. Because the substrate 102 is maintained within a vacuum, in this particular embodiment, surface 112 remains relatively uncontaminated. In alternative embodiments, surface 112 accumulates contaminants, including native oxides, contaminant films, particulate matter, and/or other types of contaminants. The contaminants are removed as part of a more extensive cleaning process of block 304.

In one such embodiment, the compound semiconductor is grown using an RP-MOCVD (reduced pressure metal organic chemical vapor deposition) tool and/or an UHV-MOCVD (ultra-high vacuum MOCVD) tool. In the exemplary embodiment, the surface 112 accumulates a native oxide layer, which is removed in block 304 using a wet chemical solution. Native oxides and other native dielectrics may prevent the formation of a termination layer, and thus, in many embodiments, the process of block 304 includes removing the native dielectric.

Referring now to FIG. 5 and block 306, an oxygen termination layer 502 is formed on the surface 112 of the substrate. The oxygen atoms of the termination layer 502 bond to the substrate 102 resulting in a reconstruction of the crystalline lattice at the surface 112. The reconstructed surface 112 exhibits a reduced number of unsaturated bonds at the surface 112 and a reduced interface trap density at the surface 112. The particular lattice that results from the formation of the termination layer 502 depends on a number of factors including the semiconductor materials included in the substrate 102 and processing parameters such as temperature and pressure.

Referring now to FIG. 6, an exemplary substrate interface 600 configuration is illustrated. The exemplary interface 600 includes a substrate 102 and a termination layer 502 substantially similar to those disclosed above. In the illustrated embodiment, the substrate 102 includes a III-V semiconductor material, although the principles of the present disclosure apply equally to any and all semiconductors. The model illustrates atoms of a Group III material (e.g., aluminum, indium, gallium, and/or combinations thereof) using hollow spheres (e.g., sphere 602) and atoms of a Group IV material (e.g., phosphorus, arsenic, antimony, and/or combinations thereof) using a first type of filled sphere 604. Oxygen atoms are represented using a second type of filled sphere 606.

In contrast to the growth of a native oxide, termination layer 502 is formed using a controlled process that results in reduced unsaturated bonds along the surface 112. In some embodiments, the process of block 306 is controlled to produce an oxide layer 502 having a single layer of oxygen atoms as illustrated in FIG. 6. In further embodiments, the process of block 306 deposits oxygen atoms deeper into the substrate 102 creating multiple layers of oxygen atoms. As a result, oxygen termination layer 502 may be formed to any thickness, although in one exemplary embodiment, the oxygen termination layer 502 is a single oxygen atom thick.

In one exemplary embodiment, in block 306, the substrate is heated to a temperature greater than or substantially equal to 220° C. and exposed to molecular or atomic oxygen at a partial pressure of oxygen less than or substantially equal to $8 \times 10^{-5}$ Torr. This may be performed within a UHV MBE tool, an RP-MOCVD tool, a UHV-MOCVD tool, and/or within another suitable tool, and may be performed within the same tool or chamber used to deposit the semiconductor of the substrate 102.

Figure 7:
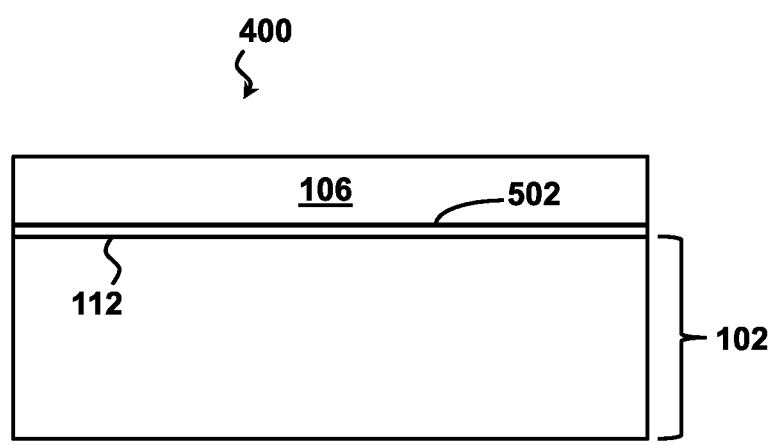
FIGS. 7-10 are diagrammatic cross-sectional views of a semiconductor device undergoing a method of forming a dielectric-semiconductor interface according to various aspects of the present disclosure.

Referring now to FIG. 7 and block 308, a dielectric layer 106 is formed over the oxygen termination layer 502. In one embodiment, the process of block 306 forms a termination layer 502 of a thickness such that when the dielectric layer 106 is formed, the termination layer 502 includes only a single layer of oxygen atoms between the substrate 102 and the dielectric layer 106. The termination layer 502 reduces the interface trap density between the substrate 102 and the dielectric layer 106. In an example, an interface between a dielectric layer 106 and a substrate 102 having a termination layer 502 is approximately on the order of $10^{11}$ defects/cm² compared to a density of approximately on the order of $10^{13}$ defects/cm$^2$ along a comparable interface lacking a termination layer 502. This compares favorably to an SI/SiO$_2$ interface, which may have approximately on the order of $10^{10}$ defects/cm$^2$.

The dielectric layer 106 may be substantially similar to the gate dielectric layer 106 of FIG. 1. In that regard, dielectric layer 106 may include comprise a dielectric material, such as a high-k dielectric material, silicon oxide, silicon nitride, silicon oxynitride, other suitable dielectric material, and/or combinations thereof. Examples of high-k dielectric material include HfO$_2$, HfSiO, HfSiON, HfTaO, HfTiO, HfZrO, zirconium oxide, aluminum oxide, hafnium dioxide-alumina (HfO$_2$—Al$_2$O$_3$) alloy, other suitable high-k dielectric materials, and/or combinations thereof. In many embodiments, the process of forming the dielectric layer 106 is controlled to avoid disrupting the oxygen termination layer 502 by controlling process variables including temperature, flow, pressure, and/or other variables known to one of skill in the art. For example, the dielectric layer 106 may be formed at a temperature less than or substantially equal to 300° C., as, in some embodiments, temperatures greater than 300° C. may compromise the oxygen termination layer 502. In one embodiment, a halfnium oxide dielectric layer 106 is formed at a temperature substantially equal to 100° C. using an atomic layer deposition tool. Other embodiments utilize other processing tools including an MBE tool and/or a MOCVD tool, and form the dielectric layer 106 to any suitable thickness.

Figure 8:
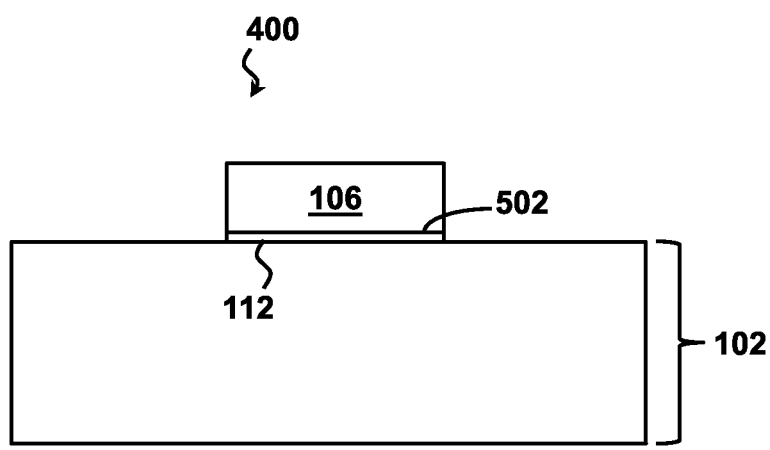

Referring now to FIG. 8 and block 310, the dielectric layer 106 and the oxygen termination layer 502 may be patterned to define a gate. In some embodiments, this patterning process is performed before a gate electrode layer is formed (e.g., the gate electrode layer formed in block 312). The patterning may also be performed after the gate electrode layer is formed. The dielectric layer 106 and the oxygen termination layer 502 may be patterned using any suitable technique including photolithography combined with wet etching, dry etching, and/or other etching processes (e.g., reactive ion etching). Other suitable techniques include ashing and maskless patterning techniques such as laser or e-beam writing.

Figure 9:
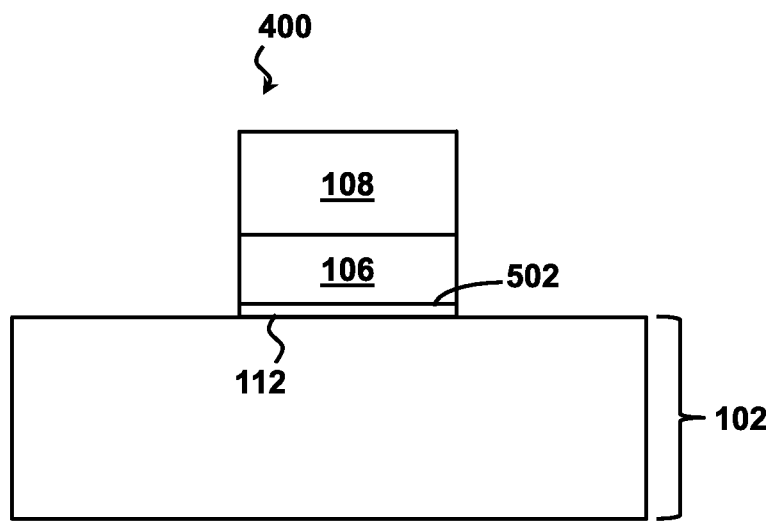

Referring now to FIG. 9 and block 312, a gate electrode layer 108 is formed over the dielectric layer 106. The gate electrode layer 108 may be substantially similar to gate electrode layer 108 of FIG. 1. In that regard, the gate electrode layer 108 may include any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments utilizing a gate last process, the gate electrode layer 108 is a dummy gate electrode and as such includes polysilicon, a masking material, and/or other suitable materials. In such embodiments, the dummy gate electrode layer 108 may later be removed in whole in or part by suitable wet and/or dry etching processes and replaced by another gate electrode layer such as one comprising a metal gate material. Work function metal gate materials included in a metal-containing gate electrode layer 108 may be n-type or p-type work function materials. Exemplary p-type work function metals include TiN, TaN, Ru, Mo, Al, WN, ZrSi$_2$, MoSi$_2$, TaSi$_2$, NiSi$_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. The work function layer may include a plurality of layers. The gate electrode layer may be deposited by CVD, PVD, and/or other suitable process and may be deposited to any suitable thickness.

Figure 10:
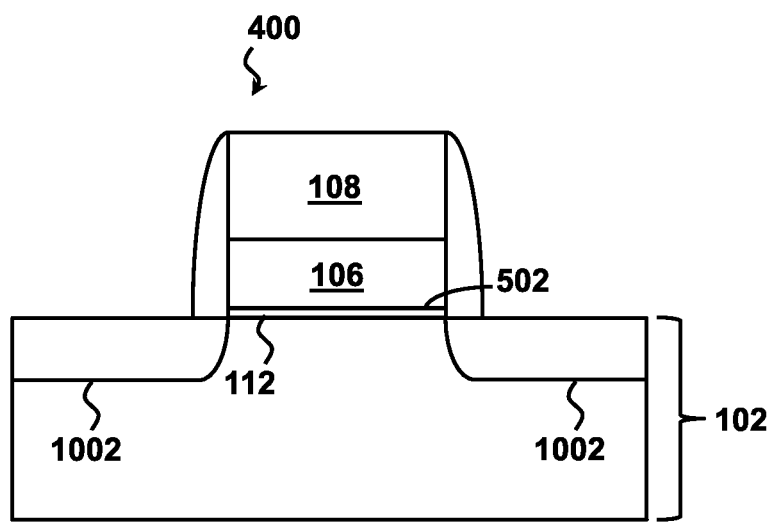

Referring now to FIG. 10 and block 314, remaining processes are performed for forming a gate stack 104 that includes the dielectric layer 106, the oxygen termination layer 502, and the gate electrode layer 108. These processes may include depositing masking layers, capping layers, forming sidewall spacers 110, dummy gate removal, and/or other gate forming processes known to one of skill in the art. In block 316, remaining processes for forming the semiconductor device 400 are performed. In the illustrated embodiment, this includes implanting source/drain regions 1002. The source/drain regions 1002 may be doped with p-type dopants (P+), such as boron or BF2, and/or n-type dopants (N+), such as phosphorus or arsenic. In some embodiments, the source/drain regions are formed by processes including halo implantation, etching, ion-implantation, epitaxy, and/or annealing steps. It is understood that the device 400 may be formed by conventional FET technology processing, and thus some processes are not described in detail herein. Likewise, it is further understood that the principles of the present disclosure apply equally to semiconductor devices regardless of type including P-channel field effect transistors (PFET), N-channel FET (NFET), metal-oxide semiconductor field effect transistors (MOSFET), complementary metal-oxide semiconductor (CMOS) transistors, FinFETs, bipolar transistors, high voltage transistors, high frequency transistors, bipolar junction transistors, resistors, capacitors, diodes, fuses, other suitable devices, and/or combinations thereof. Accordingly, the remaining processes of block 316 may vary according to the semiconductor device as known and recognized by one of skill in the art.

Figure 11:
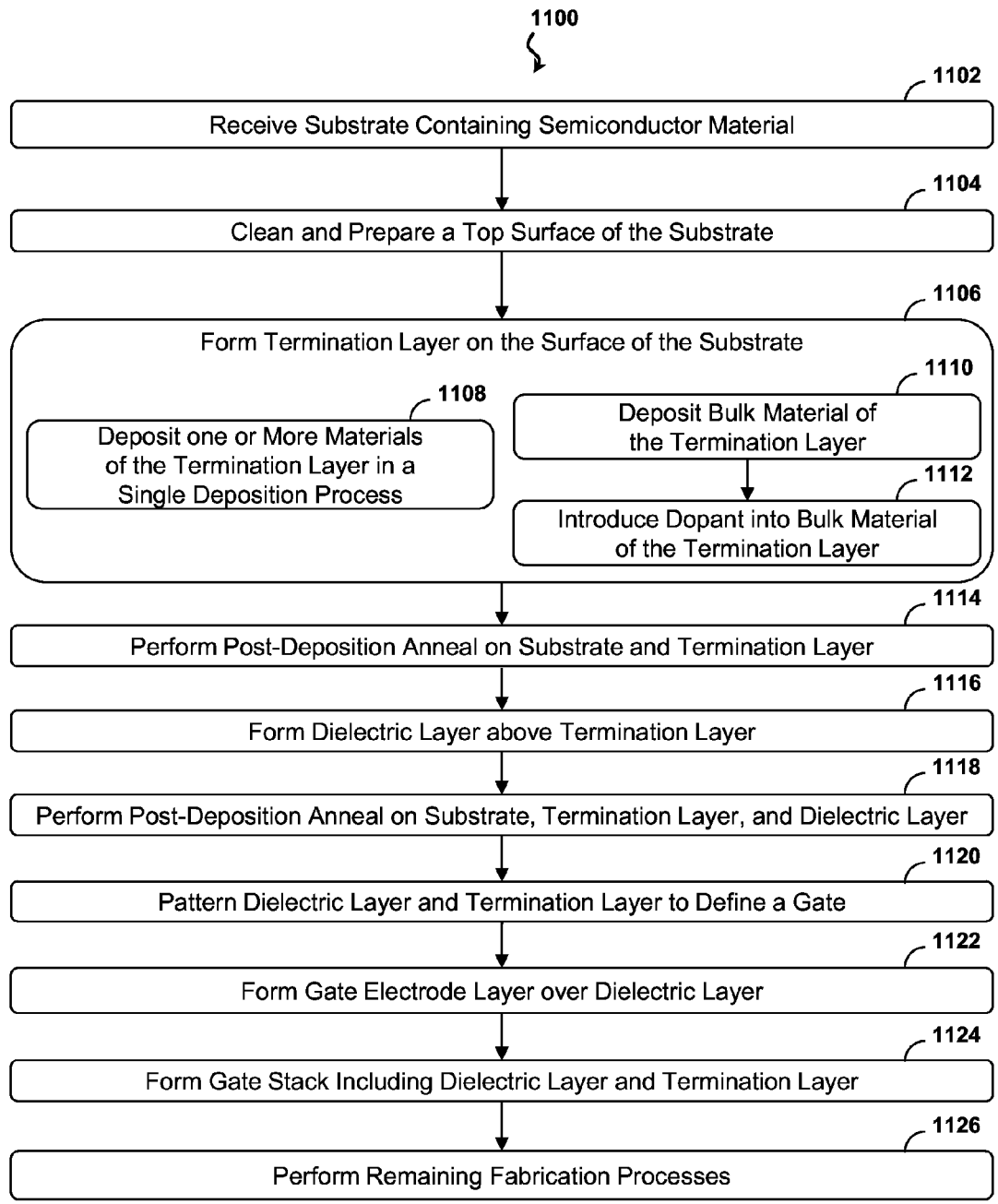
FIG. 11 is a flow diagram of a method for forming a dielectric-semiconductor interface with a diffusion barrier according to various aspects of the present disclosure.

A further exemplary method 1100 for forming a dielectric-semiconductor interface having a reduced interface trap density is described with reference made to FIGS. 11-18. FIG. 11 is a flow diagram of the method 1100 for forming a dielectric-semiconductor interface with a diffusion barrier according to various aspects of the present disclosure. It is understood that additional steps can be provided before, during, and after the method 1100, and some of the steps described can be replaced or eliminated for other embodiments of the method 1100. FIGS. 12, 13, and 15-18 are diagrammatic cross-sectional views of a semiconductor device 1200 undergoing the method 1100 of forming the dielectric-semiconductor interface according to various aspects of the present disclosure. FIG. 14 is a diagrammatic illustration of a molecular model of a substrate interface 1400 including a termination layer 1302 according to various aspects of the present disclosure.

Figure 12:
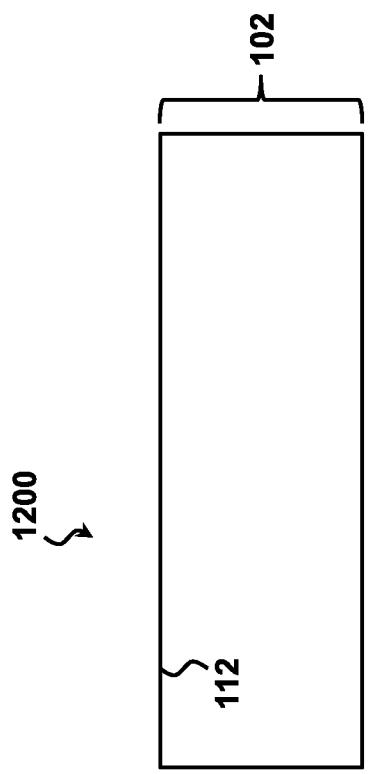
FIGS. 12 and 13 are diagrammatic cross-sectional views of a semiconductor device undergoing a method of forming a dielectric-semiconductor interface according to various aspects of the present disclosure.

Referring to block 1102 of FIG. 11 and to FIG. 12, a substrate 102 is received. The substrate 102 may be substantially similar to the substrate 102 described with respect to FIG. 1. In that regard, the substrate 102 may include a compound semiconductor material, although this is merely one example. Additionally or in the alternative, the substrate 102 may include other semiconductors and/or non-semiconductor materials. The substrate 102 may take the form of a planar substrate, a fin, a nanowire, and/or other forms known to one of skill in the art.

Referring to block 1104 of FIG. 11, a surface (e.g., top surface 112) of the substrate 102 is cleaned and prepared. The cleaning and preparation may include the application of heat, the application of a wet chemical solution (HF, HCl, and/or other solutions), mechanical polishing, the application of a vacuum such as an ultra-high vacuum (i.e., approximately on the order of $10^{-8}$ Torr or less) and/or other suitable cleaning techniques. In an exemplary embodiment, the surface 112 accumulates a native oxide layer, which is removed in block 1104 using a wet chemical solution. Native oxides and other native dielectrics may prevent the formation of a termination layer, and thus, in many embodiments, the process of block 1104 includes removing the native dielectric. In contrast, in some embodiments, the semiconductor of the substrate 102 is deposited and maintained in a vacuum, and in these particular embodiments, surface 112 remains relatively uncontaminated. In such embodiments, the surface 112 may undergo a less-extensive cleaning process in block 1104 such as heating and/or purging with an inert gas.

Figure 13:
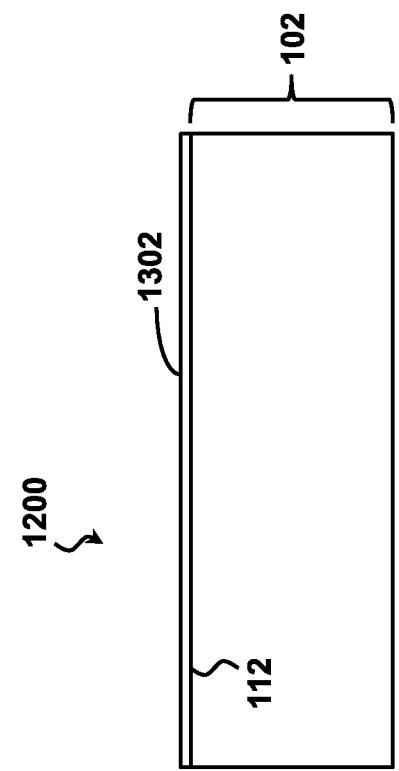
Figure 14:
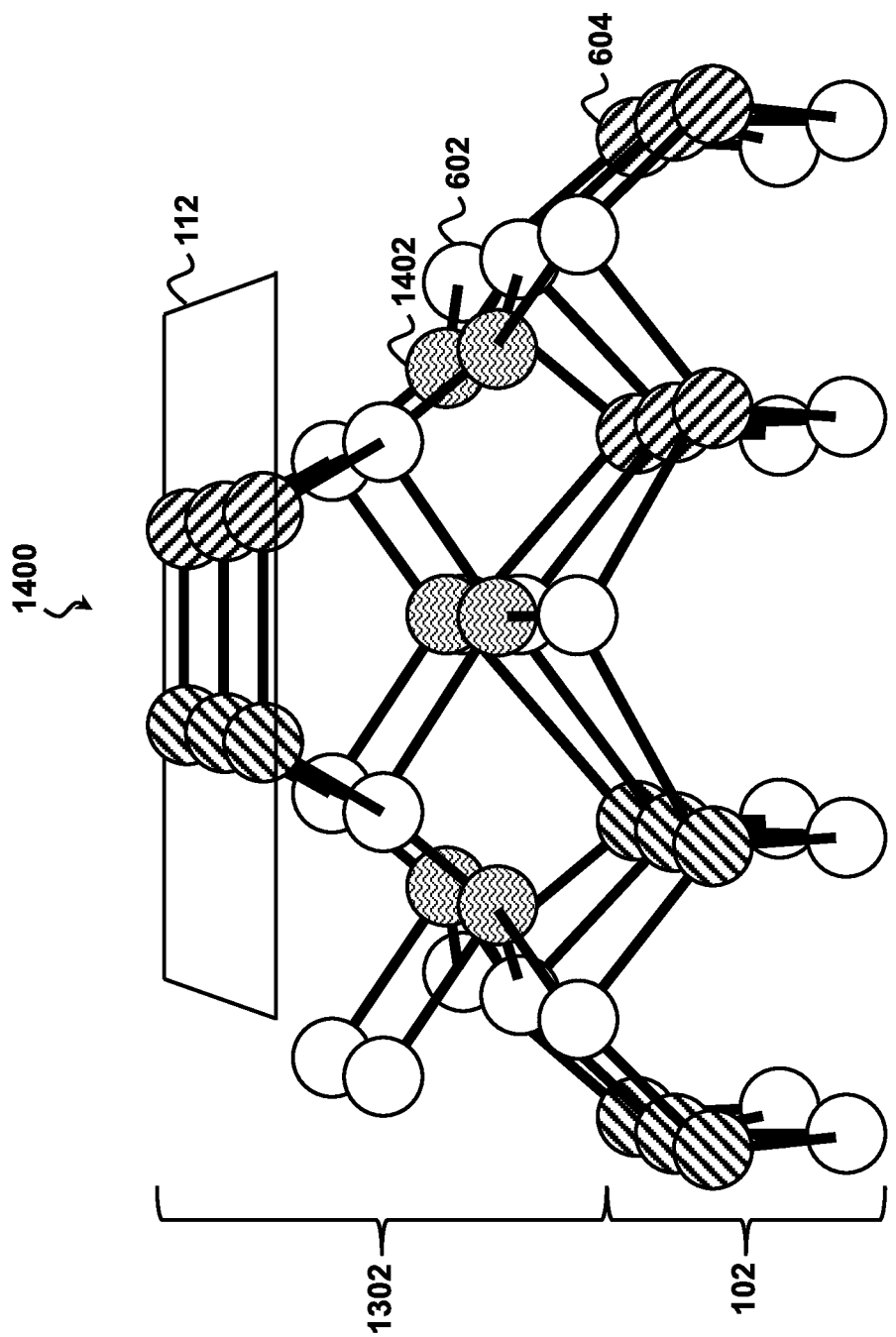
FIG. 14 is a diagrammatic illustration of a molecular model of a substrate interface including a termination layer according to various aspects of the present disclosure.

Referring now to block 1106 of FIG. 11 and to FIG. 13, a termination layer 1302 is formed on the surface 112 of the substrate. Similar to the oxygen termination layer 502 of FIGS. 5-10, the atoms of the termination layer 1302 bond to the substrate 102 resulting in a reconstruction of the crystalline lattice at the surface 112. The reconstructed surface 112 exhibits a reduced number of unsaturated bonds at the surface 112 and a reduced interface trap density when a dielectric is formed on the surface 112. Also, similar to the oxygen termination layer 502, the particular lattice that results from the formation of the termination layer 1302 depends on a number of factors including the semiconductor materials included in the substrate 102, the composition of the termination layer 1302, and processing parameters such as temperature and pressure. However, in contrast to the oxygen termination layer 502, the termination layer 1302 may include any of a number of different elements such as hydrogen, deuterium, and/or nitrogen, either alone or in combination with oxygen.

The chemical composition of the termination layer 1302 may be selected based on the application (e.g., the composition of the substrate 102 and/or the subsequently formed dielectric layer 106) to reduce interface defects at the interface between the semiconductor of the substrate 102 and the dielectric layer 106. Additionally or in the alternative, the composition of the termination layer 1302 may be selected to reduce diffusion of the dielectric layer 106 into the substrate 102. For example, some high-k dielectric deposition processes allow the deposited dielectric to react with the substrate 102. This may produce a different and unintended dielectric material at the semiconductor/dielectric interface, positioned between the substrate 102 and the high-k dielectric layer 106. In some embodiments, a termination layer 1302 that includes hydrogen, deuterium, and/or nitrogen prevents the formation of the unintended dielectric material better than a pure oxygen termination layer 502. In some such embodiments, the termination layer 1302 reduces or even eliminates the formation of the unintended dielectric material. Of course, these are merely some examples of the termination layer 1302 operating as a diffusion barrier.

In embodiments in which the termination layer 1302 includes more than one material, the disparate materials may be formed by a single monolithic deposition process or by multiple deposition processes. Examples of both cases are provided. Referring to block 1108 of FIG. 11, in one such embodiment, a termination layer 1302 is formed in a single deposition process. In the embodiment, the substrate 102 is heated to a temperature greater than or substantially equal to 220° C. and exposed to molecular or atomic oxygen in combination with one or more of H, $H_2$, $D_2$, N, or $N_2$ at a partial pressure of less than or substantially equal to $8 \times 10^{-5}$ Torr to form a doped oxygen termination layer 1302. The dopant (H, $H_2$, $D_2$, N, or $N_2$) concentration in the environment during the deposition process may be determined based on a desired concentration of the dopant in the termination layer 1302 and in various examples ranges from about 0.01% to about 20%. In other embodiments, the substrate 102 is heated to a temperature greater than or substantially equal to 220° C. and exposed to one or more of H, $H_2$, $D_2$, N, or $N_2$ (without oxygen) at a partial pressure of less than or substantially equal to $8 \times 10^{-5}$ Torr to form the termination layer 1302. Deposition may be performed within a UHV MBE tool, an RP-MOCVD tool, a UHV-MOCVD tool, and/or within another suitable tool, and may be performed within the same tool or chamber used to form the substrate 102 by, for example, depositing a semiconductor of the substrate 102.

Referring to blocks 1110 and 1112 of FIG. 11, in another such embodiment, a termination layer 1302 is formed using multiple deposition processes. In block 1110, a bulk material is deposited first. The bulk material may be formed by any suitable process including the deposition processes of block 306 of FIG. 3 and/or block 1108 of FIG. 11. In an exemplary embodiment, the substrate 102 is heated and exposed to molecular or elemental oxygen to form a bulk material including one or more layers of oxygen. In another exemplary embodiment, the substrate 102 is heated to a temperature greater than or substantially equal to 220° C. and exposed to one or more of H, $H_2$, $D_2$, N, or $N_2$ (with or without oxygen) at a partial pressure of less than or substantially equal to $8 \times 10^{-5}$ Torr to form the bulk material of the termination layer 1302. Then, in block 1112, one or more dopants are added to the bulk material to form the termination layer 1302. As described above, the dopants may include hydrogen, deuterium, nitrogen, and/or other suitable dopants. Furthermore, for a bulk material that includes hydrogen, deuterium, nitrogen, and/or other non-oxygen materials, oxygen may be used as a dopant. MBE and/or other suitable deposition processes may be used to introduce the dopant(s) into the bulk material. In various examples, the dopant(s) are added to produce a desired concentration of the dopant(s) in the termination layer 1302, which in various examples ranges from about 0.01% to about 20%.

Whether formed via a single deposition process or multiple deposition processes, the termination layer 1302 may be formed to any suitable thickness, and in an exemplary embodiment, the termination layer 1302 is a single atom thick measured from the semiconductor of the substrate 102 to the subsequent dielectric layer 106. In further embodiments, the process(es) of block 1106 deposits atoms deeper into the substrate 102 creating a termination layer 1302 multiple layers of atoms thick.

After depositing the termination layer 1302, a post-deposition anneal may be performed before (e.g., block 1114) and/or after (e.g., block 1118) forming a dielectric layer 106 on the termination layer 1302. As discussed above, the termination layer 1302 may be used to reduce the occurrence of interface traps or defects. However, the growth of the termination layer 1302 may itself introduce further defects, thereby reducing its effectiveness in this regard. To ameliorate this, a post-deposition anneal may be performed to reduce defects within the termination layer 1302 and/or defects at the interface between the termination layer 1302 and the dielectric layer 106. In one such embodiment, the annealing process of block 1114 and/or block 1118 includes heating the semiconductor device 1200 to a temperature of between about 150° C. and about 350° C. This range is selected to avoid disrupting the termination layer 1302, which has been shown to occur in some embodiments when the temperature of the semiconductor device 1200 rises above about 350° C. In further embodiments, disruption of the termination layer 1302 occurs when the temperature of the device 1200 rises above about 300° C., and in such embodiments, the annealing is performed at a temperature between about 150° C. and about 300° C. With respect to the lower end of the range, it has been shown that annealing temperatures of less than about 150° C. fail to produce noticeable changes in the termination layer 1302. The annealing time may vary from a few seconds to a few hours.

Referring now to FIG. 14, an exemplary substrate interface 1400 configuration is illustrated. The exemplary interface 1400 includes a substrate 102 and a termination layer 1302 substantially similar to those disclosed above. In the illustrated embodiment, the substrate 102 includes a III-V semiconductor material, although the principles of the present disclosure apply equally to any and all semiconductors. The model illustrates atoms of a Group III material (e.g., aluminum, indium, gallium, and/or combinations thereof) using hollow spheres (e.g., sphere 602) and atoms of a Group IV material (e.g., phosphorus, arsenic, antimony, and/or combinations thereof) using a first type of filled sphere 604. Atoms particular to the termination layer 1302 (e.g., oxygen, hydrogen, deuterium, and/or nitrogen) are represented using a second type of filled sphere 1402.

Similar to the termination layer 502 of FIGS. 5-10, the termination layer 1302 is formed using a controlled process that results in reduced unsaturated bonds along the surface 112. In some embodiments, the process of block 1106 is controlled to produce a termination layer 1302 having a single layer of atoms 1402 as illustrated in FIG. 14. In further embodiments, the process of block 1106 deposits atoms deeper into the substrate 102 creating multiple layers of atoms 1402. As a result, the termination layer 1302 may be formed to any thickness, although in one exemplary embodiment, the termination layer 1302 is a single atom thick.

Figure 15:
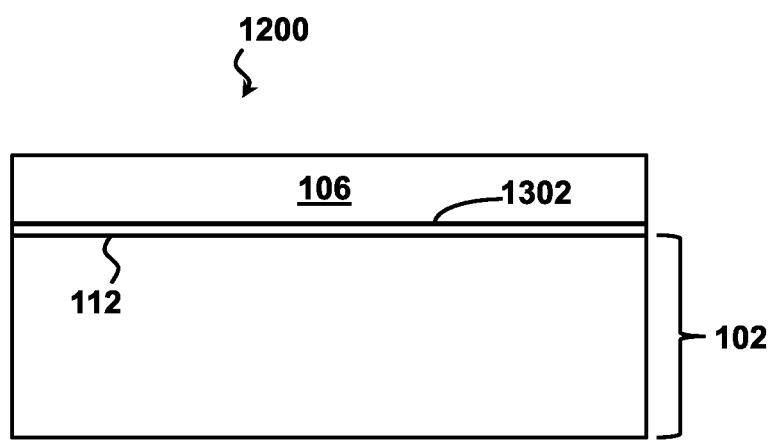
FIGS. 15-18 are diagrammatic cross-sectional views of a semiconductor device undergoing a method of forming a dielectric-semiconductor interface according to various aspects of the present disclosure.

Referring now to FIG. 15 and block 1116, a dielectric layer 106 is formed over the termination layer 1302. In one embodiment, the process of block 1106 forms a termination layer 1302 of a thickness such that when the dielectric layer 106 is formed, the termination layer 1302 includes only a single layer of atoms between the substrate 102 and the dielectric layer 106. In contrast to the growth of a native oxide, termination layer 1302 is formed using a controlled process that reduces the number of unsaturated bonds between the substrate 102 and the dielectric layer 106. In an example, an interface between a dielectric layer 106 and a substrate 102 having a termination layer 1302 is approximately on the order of $10^{11}$ defects/cm$^2$ compared to a density of approximately on the order of $10^{13}$ defects/cm$^2$ along a comparable interface lacking a termination layer 1302. This compares favorably to an SI/SIO$_2$ interface, which may have approximately on the order of $10^{10}$ defects/cm$^2$.

The dielectric layer 106 may be substantially similar to the gate dielectric layer 106 of FIG. 1. In that regard, dielectric layer 106 may include comprise a dielectric material, such as a high-k dielectric material, silicon oxide, silicon nitride, silicon oxynitride, other suitable dielectric material, and/or combinations thereof. Examples of high-k dielectric material include HfO$_2$, HfSiO, HfSiON, HfTaO, HfTiO, HfZrO, zirconium oxide, aluminum oxide, hafnium dioxide-alumina (HfO$_2$—Al$_2$O$_3$) alloy, other suitable high-k dielectric materials, and/or combinations thereof. In many embodiments, the process of forming the dielectric layer 106 is controlled to avoid disrupting the termination layer 1302 by controlling process variables including temperature, flow, pressure, and/or other variables known to one of skill in the art. For example, the dielectric layer 106 may be formed at a temperature less than or substantially equal to 300° C., as, in some embodiments, temperatures greater than about 300° C. will compromise the termination layer 1302. In one embodiment, a hafnium oxide dielectric layer 106 is formed at a temperature substantially equal to 100° C. using an atomic layer deposition tool. Other embodiments utilize other processing tools including an MBE tool and/or a MOCVD tool, and form the dielectric layer 106 to any suitable thickness. As discussed above, the deposition of the dielectric layer 106 may be followed by a post-deposition anneal as shown in block 1118.

Figure 16:
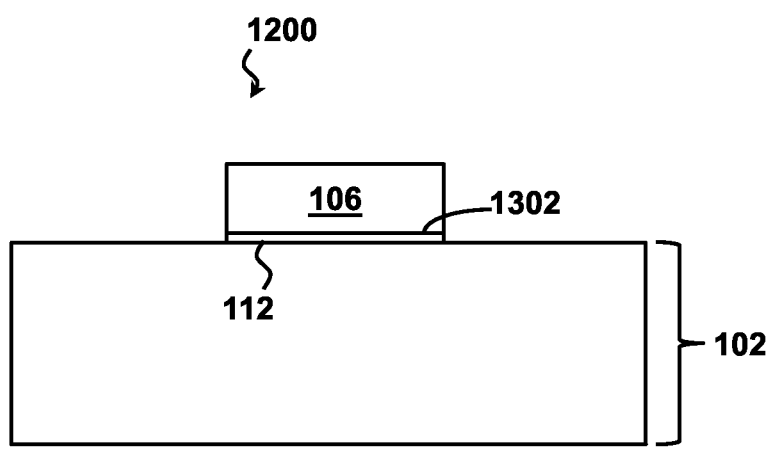

Referring now to FIG. 16 and block 1120, the dielectric layer 106 and the termination layer 1302 may be patterned to define a gate. In some embodiments, this patterning process is performed before a gate electrode layer is formed (e.g., the gate electrode layer formed in block 1122). The patterning may also be performed after the gate electrode layer is formed. The dielectric layer 106 and the termination layer 1302 may be patterned using any suitable technique including photolithography combined with wet etching, dry etching, and/or other etching processes (e.g., reactive ion etching). Other suitable techniques include ashing and maskless patterning techniques such as laser or e-beam writing.

Figure 17:
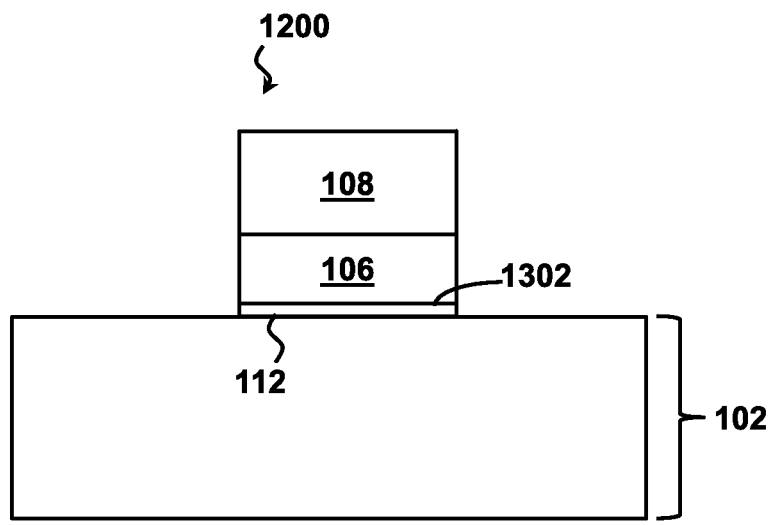

Referring now to FIG. 17 and block 1122, a gate electrode layer 108 is formed over the dielectric layer 106. The gate electrode layer 108 may be substantially similar to gate electrode layer 108 of FIG. 1. In that regard, the gate electrode layer 108 may include any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments utilizing a gate last process, the gate electrode layer 108 is a dummy gate electrode and as such includes polysilicon, a masking material, and/or other suitable materials. In such embodiments, the dummy gate electrode layer 108 may later be removed in whole in or part by suitable wet and/or dry etching processes and replaced by another gate electrode layer such as one comprising a metal gate material. Work function metal gate materials included in a metal-containing gate electrode layer 108 may be n-type or p-type work function materials. Exemplary p-type work function metals include TiN, TaN, Ru, Mo, Al, WN, ZrSi$_2$, MoSi$_2$, TaSi$_2$, NiSi$_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. The work function layer may include a plurality of layers. The gate electrode layer 108 may be deposited by CVD, PVD, and/or other suitable process and may be deposited to any suitable thickness.

Figure 18:
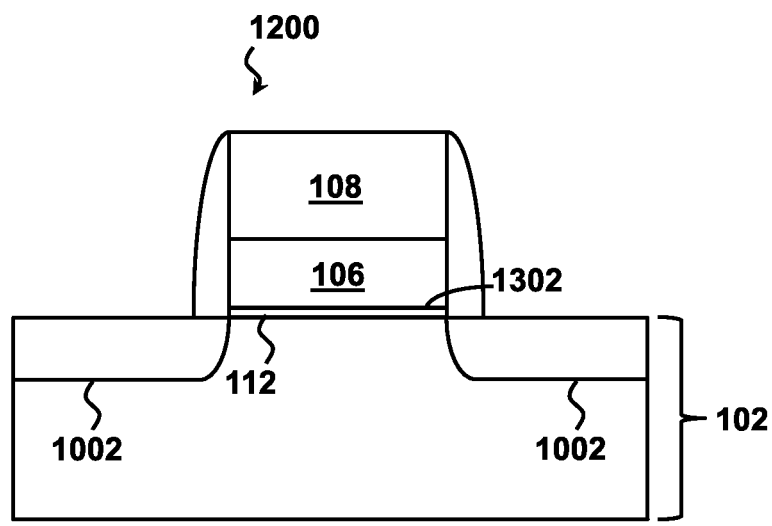

Referring now to FIG. 18 and block 1124, remaining processes are performed for forming a gate stack 104 substantially similar to the gate stack 104 of FIG. 1 that includes the dielectric layer 106, the termination layer 1302, and the gate electrode layer 108. These processes may include depositing masking layers, capping layers, forming sidewall spacers 110, dummy gate removal, and/or other gate forming processes known to one of skill in the art.

In block 1126, remaining processes for forming the semiconductor device 1200 are performed. In the illustrated embodiment, this includes implanting source/drain regions 1002. The source/drain regions 1002 may be doped with p-type dopants (P+), such as boron or BF2, and/or n-type dopants (N+), such as phosphorus or arsenic. In some embodiments, the source/drain regions are formed by processes including halo implantation, etching, ion-implantation, epitaxy, and/or annealing steps. It is understood that the device 1200 may be formed by conventional FET technology processing, and thus some processes are not described in detail herein. Likewise, it is further understood that the principles of the present disclosure apply equally to semiconductor devices regardless of type including P-channel field effect transistors (PFET), N-channel FET (NFET), metal-oxide semiconductor field effect transistors (MOSFET), complementary metal-oxide semiconductor (CMOS) transistors, FinFETs, bipolar transistors, high voltage transistors, high frequency transistors, bipolar junction transistors, resistors, capacitors, diodes, fuses, other suitable devices, and/or combinations thereof. Accordingly, the remaining processes of block 1126 may vary according to the semiconductor device as known and recognized by one of skill in the art.

Thus, the present disclosure provides a semiconductor/dielectric interface having reduced interface trap density and provides a method for forming the interface. In some embodiments, the method of forming a semiconductor device comprises: receiving a substrate, the substrate containing a semiconductor; preparing a surface of the substrate; forming a termination layer on the semiconductor at the surface of the substrate; and depositing a dielectric layer above the termination layer, the depositing configured to not disrupt the termination layer. In one such embodiment, the forming of the termination layer is configured to produce the termination layer having a single layer of oxygen atoms between the substrate and the dielectric layer. In a further such embodiment, the forming of the termination layer is performed at a partial pressure lower or substantially equal to $8\times10^{-5}$ Torr. In another such embodiment, the forming of the termination layer is performed at a temperature above or substantially equal to 220° C. In another such embodiment, the depositing of the dielectric layer deposits at least one of $HfO_2$, HfSiO, HfSiON, HfTaO, HfSiO, HfZrO, zirconium oxide, aluminum oxide, and a hafnium dioxide-alumina ($HfO_2$—$Al_2O_3$) alloy. In a further such embodiment, the configuring of the deposition to not disrupt the termination layer includes performing the deposition at a temperature less than or substantially equal to 300° C. In another such embodiment, the depositing of the dielectric layer deposits HfO2; and the configuring of the deposition to not disrupt the termination layer includes performing the deposition at a temperature less than or substantially equal to 100° C. In some such embodiments, the semiconductor is a compound semiconductor. In one such embodiment, the method further comprises forming a gate structure on the substrate, the gate structure including the termination layer and the dielectric layer.

In some embodiments, the method of fabricating an integrated circuit device comprises: receiving a substrate including a compound semiconductor material; forming a gate stack on a surface of the substrate, the forming of the gate stack comprising: forming a termination layer on the surface of the substrate; depositing a dielectric layer on the termination layer, the depositing of the dielectric layer configured to not disrupt the termination layer; and depositing a gate electrode layer over the dielectric layer. In some such embodiments, the forming of the termination layer bonds oxygen atoms to unsaturated atoms within the compound semiconductor material and reduces the interface trap density at the surface. In another such embodiment, the forming of the termination layer produces the termination layer having a single layer of oxygen atoms between the substrate and the dielectric layer. In a further such embodiment, the forming of the termination layer is performed at a partial pressure lower or substantially equal to $8\times10^{-5}$ Torr. In another such embodiment, the forming of the termination layer is performed at a temperature above or substantially equal to 220° C. In some such embodiments, the configuring of the deposition to not disrupt the termination layer includes performing the deposition at a temperature less than or substantially equal to 300° C. In another such embodiment, the depositing of the dielectric layer deposits $HfO_2$, and the configuring of the deposition to not disrupt the termination layer includes performing the deposition at a temperature less than or substantially equal to 100° C.

In further embodiments, the semiconductor/dielectric interface comprises: a substrate including a semiconductor material; a termination layer disposed on the semiconductor material; and a dielectric layer disposed over the termination layer. In some such embodiments, the semiconductor material includes a compound semiconductor material. In one such embodiment, the interface further comprises a gate electrode disposed over the dielectric layer. In another such embodiment, the termination layer has only a single layer of oxygen atoms between the substrate and the dielectric layer.

In some embodiments, the method of forming a semiconductor device includes receiving a substrate and forming a termination layer on a top surface of the substrate. The termination layer includes at least one of hydrogen, deuterium, or nitrogen, alone or in combination with oxygen. The method further includes depositing a dielectric layer on the termination layer, wherein the depositing of the dielectric layer is configured to not disrupt the termination layer. In one embodiment, the termination layer is formed using a first deposition process that deposits a first material of the termination layer and a subsequent deposition process that introduces a second material of the termination layer into the first material (the first material being different from the second material). In one embodiment, the termination layer is formed by a single deposition process that deposits both a first material and a second material of the termination layer (the first material being different from the second material).

In some embodiments, the method of fabricating an integrated circuit device includes receiving a substrate including a compound semiconductor material; and forming a gate stack on a surface of the substrate. In turn, the forming of the gate stack includes: removing a native oxide from the surface of the substrate; thereafter forming a termination layer including at least one of hydrogen, deuterium, or nitrogen on the surface of the substrate; depositing a dielectric layer on the termination layer, the depositing of the dielectric layer configured to not disrupt the termination layer; and depositing a gate electrode layer over the dielectric layer. In some embodiments, the method further includes performing a post-deposition anneal after the forming of the termination layer and prior to the depositing of the dielectric layer on the termination layer. In some embodiment, the method further includes performing a post-deposition anneal after the depositing of the dielectric layer on the termination layer.

In yet further embodiments, the semiconductor/dielectric interface includes a substrate including a semiconductor material; a termination layer including at least one of hydrogen, deuterium, and nitrogen disposed on the semiconductor material, wherein the termination layer is free of a native oxide; and a dielectric layer disposed over the termination layer. In some embodiments, the termination layer further includes oxygen. In one such embodiment, the termination layer has only a single layer of oxygen atoms between the substrate and the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   receiving a substrate;
   forming a termination layer on a top surface of the substrate, using one of a molecular beam epitaxy (MBE) process and a chemical vapor deposition (CVD) process, wherein the termination layer includes deuterium deposited within the substrate during the formation of the termination layer, such that a portion of a semiconductor of the substrate remains at the top surface of the substrate;
   after forming the termination layer and after deposition of the deuterium, using an atomic layer deposition (ALD) process to deposit a dielectric layer including $HfO_2$, at a temperature less than or substantially equal to 100° C., on the portion of the semiconductor remaining at the top surface of the substrate, wherein the depositing of the dielectric layer is configured to not disrupt the termination layer; and
   during the deposition of the dielectric layer, using the termination layer as a diffusion barrier to material deposited by the ALD process;
   wherein the forming of the termination layer produces the termination layer having multiple layers of deuterium atoms between the substrate and the dielectric layer.

2. The method of claim 1, wherein the forming the termination layer includes forming the termination layer by heating the substrate and exposing the heated substrate to molecular or atomic oxygen in combination with $D_2$ at a partial pressure lower or substantially equal to $8\times10^{-5}$ Torr.

3. The method of claim 1, wherein a concentration of the deuterium in the termination layer is between about 0.01% and about 20%.

4. The method of claim 1, wherein the forming of the termination layer includes a first deposition process that deposits a first material of the termination layer and a subsequent deposition process that introduces a second material of the termination layer into the first material, and wherein the second material is different from the first material.

5. The method of claim 4,
   wherein the first material includes oxygen;
   wherein the second material includes the deuterium; and
   wherein the second deposition process uses molecular beam epitaxy to introduce the second material into the first material.

6. The method of claim 1, wherein a first post-deposition anneal is performed, after the forming the termination layer and prior to deposition of the dielectric layer, at a temperature between about 150 degrees Celsius and about 300 degrees Celsius.

7. The method of claim 6, wherein a second post-deposition anneal is performed, after deposition of the dielectric layer, at a temperature between about 150 degrees Celsius and about 300 degrees Celsius.

8. The method of claim 1 further comprising removing a native oxide from the top surface of the substrate prior to the forming of the termination layer on the top surface.

9. A method of fabricating an integrated circuit device, the method comprising:
   receiving a substrate including a compound semiconductor material; and
   forming a gate stack on a surface of the substrate, the forming of the gate stack including:
      removing a native oxide from the surface of the substrate;
      thereafter forming a termination layer, using one of a molecular beam epitaxy (MBE) process and a chemical vapor deposition (CVD) process, including at least one of hydrogen, deuterium, or nitrogen on the surface of the substrate, the forming of the termination layer configured so that the at least one of hydrogen, deuterium, or nitrogen is deposited within the compound semiconductor material of the substrate during the formation of the termination layer;
      after forming the termination layer and after deposition of the at least one of hydrogen, deuterium, or nitrogen, depositing a dielectric layer including $HfO_2$, by atomic layer deposition (ALD) at a temperature less than or substantially equal to 100° C., on a portion of the compound semiconductor material disposed above the at least one of hydrogen, deuterium, or nitrogen of the termination layer, the depositing of the dielectric layer configured to not disrupt the termination layer; and
      depositing a gate electrode layer over the dielectric layer;
   wherein the forming of the termination layer produces the termination layer having multiple layers of at least one of hydrogen atoms, deuterium atoms, or nitrogen atoms between the surface of the substrate and the dielectric layer.

10. The method of claim 9 further comprising performing a post-deposition anneal after the forming of the termination layer and prior to the depositing of the dielectric layer on the termination layer.

11. The method of claim 9 further comprising performing a post-deposition anneal after the depositing of the dielectric layer on the termination layer.

12. The method of claim 9 wherein the forming of the termination layer includes:
   depositing an oxygen-containing material of the termination layer on the surface of the substrate;
   depositing the at least one of hydrogen, deuterium, or nitrogen within the oxygen-containing material using a molecular beam epitaxial process.

13. The method of claim 12, wherein the oxygen-containing material and the at least one of hydrogen, deuterium, or nitrogen are deposited in combination with each other using a single deposition process.

14. The method of claim 12, wherein the oxygen-containing material and the at least one of hydrogen, deuterium, or nitrogen are deposited separately using multiple deposition processes.

15. The method of claim 9, wherein the depositing of the dielectric layer deposits at least one of HfSiO, HfSiON, HfTaO, HfSiO, HfZrO, zirconium oxide, aluminum oxide, or a hafnium dioxide-alumina ($HfO_2$—$Al_2O_3$) alloy.

16. A device comprising:
a substrate including a semiconductor material;
a termination layer disposed on the semiconductor material, wherein the termination layer includes one of a molecular beam epitaxy (MBE) deposited layer and a chemical vapor deposition (CVD) deposited layer, and wherein the termination layer is free of a native oxide and includes:
   a layer containing at least one of hydrogen, deuterium, or nitrogen; and
   a region of the semiconductor material disposed opposite the substrate on the layer containing the at least one of hydrogen, deuterium, or nitrogen; and
an atomic layer deposition deposited dielectric layer disposed over the termination layer and on the region of the semiconductor material, wherein the termination layer is free from material deposited by the atomic layer deposition;
wherein the termination layer includes multiple layers of at least one of hydrogen atoms, deuterium atoms, or nitrogen atoms between the substrate and the dielectric layer.

17. The device of claim 16, wherein the termination layer further includes oxygen.

18. The device of claim 17, wherein the termination layer has multiple layers of oxygen atoms between the substrate and the dielectric layer.

19. The device of claim 16, wherein a concentration of the at least one of the hydrogen, deuterium, or nitrogen in the termination layer is between about 0.01% and about 20%.

\* \* \* \* \*